(12) United States Patent
Ballif et al.

(10) Patent No.: US 10,727,358 B2
(45) Date of Patent: Jul. 28, 2020

(54) SOLAR PHOTOVOLTAIC MODULE

(71) Applicant: CSEM CENTRE SUISSE D'ELECTRONIQUE ET DE MICROTECHNIQUE SA—RECHERCHE ET DÉVELOPPEMENT, Neuchâtel (CH)

(72) Inventors: Christophe Ballif, Neuchâtel (CH); Toralf Scharf, Neuchâtel (CH); Jordi Escarre, Neuchâtel (CH)

(73) Assignee: CSEM Centre Suisse d'Electronique et de Microtechnique SA—Recherche et Développement, Neuchâtel (CH)

( * ) Notice: Subject to any disclaimer, the term of this patent is extended or adjusted under 35 U.S.C. 154(b) by 0 days.

(21) Appl. No.: 14/784,570

(22) PCT Filed: Apr. 15, 2014

(86) PCT No.: PCT/EP2014/057615
§ 371 (c)(1),
(2) Date: Oct. 14, 2015

(87) PCT Pub. No.: WO2014/170323
PCT Pub. Date: Oct. 23, 2014

(65) Prior Publication Data
US 2016/0064577 A1    Mar. 3, 2016

(30) Foreign Application Priority Data
Apr. 16, 2013 (EP) .................................. 13164014

(51) Int. Cl.
*H01L 31/0216* (2014.01)
*H01L 31/054* (2014.01)
(Continued)

(52) U.S. Cl.
CPC .. *H01L 31/02165* (2013.01); *H01L 31/02167* (2013.01); *H01L 31/02168* (2013.01);
(Continued)

(58) Field of Classification Search
CPC ......... H01L 31/02165; H01L 31/02167; H01L 31/054; H01L 31/02168; H01L 31/022441; H01L 31/0747; H01L 31/0543
See application file for complete search history.

(56) References Cited

U.S. PATENT DOCUMENTS

2002/0185170 A1* 12/2002 Shiotsuka ............ C09D 133/04
136/251
2007/0109400 A1* 5/2007 Woodgate .......... G02B 27/2214
348/47
(Continued)

FOREIGN PATENT DOCUMENTS

EP         2 051 124 A2      4/2009
JP      WO2013047827   *  4/2013 ............. H01L 31/00
WO      2008/072224 A2      6/2008

OTHER PUBLICATIONS

International Search Report dated Jul. 8, 2014, in corresponding International Application No. PCT/EP2014/057615, filed Apr. 15, 2014, 6 pages.
(Continued)

*Primary Examiner* — Uyen M Tran
(74) *Attorney, Agent, or Firm* — Christensen O'Connor Johnson Kindness PLLC

(57) ABSTRACT

In the present invention a new solar photovoltaic module is proposed comprising: a silicon based photovoltaic element; an intermediate layer deposited on said photovoltaic element to the incident light side; an interference filter deposited on the incident light side of said intermediate layer; a front element disposed on the incident light side of said interference filter. Said intermediate layer has a transparency of at
(Continued)

least 90% for infrared light between 780 nm and 1200 nm and said interference filter is corrugated and composed of a multilayer comprising a plurality of dielectric layers designed to transmit at least 75% of the total incident solar infrared light between 780 nm and 1200 nm, and to reflect and diffuse incident visible solar light such that the perceived color of said reflected and diffused visible light by any observer positioned anywhere to the incident light side of said solar photovoltaic module and looking towards the front element of said solar photovoltaic module is defined by a Y10 tristimulus value not lower than 50 defined by an x value of 0.20 to 0.45 and a y value of 0.20 to 0.45 in a chromaticity diagram of a CIE 1964 Yxy color system using a white light source measured with a D65 light source with a 10-degree angular field.

21 Claims, 9 Drawing Sheets

(51) Int. Cl.
*H01L 31/0224* (2006.01)
*H01L 31/0747* (2012.01)

(52) U.S. Cl.
CPC .... *H01L 31/022441* (2013.01); *H01L 31/054* (2014.12); *H01L 31/0543* (2014.12); *H01L 31/0747* (2013.01); *Y02E 10/52* (2013.01)

(56) References Cited

U.S. PATENT DOCUMENTS

| | | | |
|---|---|---|---|
| 2009/0159123 A1 | 6/2009 | Kothari | |
| 2009/0165849 A1* | 7/2009 | Chan | H01L 31/02165 |
| | | | 136/256 |
| 2009/0293948 A1* | 12/2009 | Tucci | H01L 31/02168 |
| | | | 136/256 |
| 2010/0193010 A1 | 8/2010 | Wells | |
| 2011/0126890 A1* | 6/2011 | Borrelli | H01L 31/02366 |
| | | | 136/255 |
| 2014/0130855 A1* | 5/2014 | Gu | H01L 31/0524 |
| | | | 136/255 |
| 2014/0216549 A1* | 8/2014 | Satoh | G02B 5/0215 |
| | | | 136/259 |

OTHER PUBLICATIONS

Selj, J.H., et al., "Reduction of Optical Losses in Colored Solar Cells With Multilayer Antireflection Coatings," Solar Energy Materials and Solar Cells 95:2576-2582, May 2011.

Pélisset, S., et al., "Efficiency of Silicon Thin-Film Photovoltaic Modules With a Front Coloured Glass," Proceedings of the International Conference on Cleantech for Smart Cities & Buildings from Nano to Urban Scale (CISBAT), Lausanne, Switzerland, Sep. 14-16, 2011, pp. 37-42.

* cited by examiner

SOLAR PHOTOVOLTAIC MODULE

TECHNICAL FIELD

The present invention relates to the field of solar cells. More particularly, the present invention relates to a solar photovoltaic module comprising a silicon based photovoltaic element, an intermediate layer deposited on said photovoltaic element to the incident light side, an interference filter deposited on the incident light side of said intermediate layer, and a front element disposed on the incident light side of said interference filter.

BACKGROUND OF THE INVENTION

Despite the wide diversity of available solar technologies, solar energy systems are still not considered as main stream technologies in building practice. So far most photovoltaic systems are optimized only for efficiency which implies absorbing a maximum number of photons, and hence leading to a dark blue and ideally black color appearance. Most of the photovoltaic cells on the market are crystalline cells with connecting ribbons which have an unaesthetic appearance.

One of the reasons of the lack of wide spread use of solar technologies for buildings is the lack of awareness and knowledge of integration possibilities among architects and the lack of solar products designed for building integration. In parallel there is a recent trend to transform buildings from energy users to energy producers. The old wide spread concept of adding solar panels on the roof of a building has evolved and a lot of effort is being done to merge the construction technology with the science and technology of photovoltaics in what is called the Building Integrated Photovoltaics. Architectural, structural and aesthetic solutions are being constantly seeken to integrate solar photovoltaic elements into buildings, allowing the incorporation of energy generation into everyday structures such as homes, schools, offices hospitals and all kind of buildings. Photovoltaic modules can have a wide variety of functions such as noise protection, safety, electromagnetic shielding, thermal isolation etc. Photovoltaic elements can also be used to combine these functions with an aesthetic function. With such an approach solar photovoltaic modules become more and more construction elements serving as building exteriors such as façades and inclined roofs. If well applied, solar photovoltaic cells can increase a building's character and its value.

The more technologies will be available to create aesthetic effects with photovoltaic cells the more the technology will be accepted and costs will decline. Not only new building construction will profit from this trend but also the improvement and modification of existing buildings. Architects who apply Photovoltaic cells in an intelligent manner can as such contribute largely to the acceptance of this technology.

One of the technology improvements would be to dispose of a solar photovoltaic module that has an appearance that is more aesthetic than the classical blue-black appearance. In other approaches front colored glass is integrated with the photovoltaic modules, such as explained in the following publication: "Efficiency of silicon thin-film photovoltaic modules with a front colored glass; S. Pélisset et al., Proceedings CISBAT 2011, pp. 37-42." In other approaches technology solutions have been initiated to render a specific color to a photovoltaic cell by the deposition of multilayer antireflection coatings on such photovoltaic elements, as for example described in the article: "Reduction of optical losses in colored solar cells with multilayer antireflection coatings; J. H. Selj et al., Solar Energy Materials & Solar Cells 95, pp. 2576-2582, 2011".

EP 2051124 discloses a design comprising, to the incident light side of the photoconversion element, a passive interference filter or an addressable optical resonance cavity, allowing to produce a specific color to an observer. The design in EP 2051124 requires a complex and expensive technology and is limited to produce specific colors, excluding white and grey and does not allow to produce a mate appearance of these colors.

In all approaches of prior art it is necessary to add additional light diffusing layers to a photovoltaic cell, such as a colored glass plate or an interference filter, which makes the realization process complex and expensive and it may also reduce the photoconversion efficiency. It is the objective of the present invention to bring a new approach in this field.

SUMMARY OF THE INVENTION

An object of the present invention is to propose a solar module with an appearance which is particularly attractive to render an aesthetic appearance for the integration of photovoltaic elements in buildings.

Accordingly, the present invention relates to a solar photovoltaic module comprising:
  a silicon based photovoltaic element,
  an intermediate layer deposited on said photovoltaic element to the incident light side,
  an interference filter deposited on the incident light side of said intermediate layer,
  a front element disposed on the incident light side of said interference filter.

According to the invention the intermediate layer has a transparency of at least 90% for infrared light between 780 nm and 1200 nm.

Moreover, the interference filter of the solar photovoltaic module has a corrugated shape and is composed of a multilayer comprising a plurality of dielectric layers designed to transmit at least 75% of the total incident solar infrared light between 780 nm and 1200 nm, and to reflect and diffuse incident visible solar light such that the perceived color of said reflected and diffused visible light by any observer positioned anywhere, or preferably at least within 45° to the normal to the incident light side surface of said solar photovoltaic module 1, and looking towards the front element of said solar photovoltaic module 1 is defined by a Y10 tristimulus value not lower than 50, and preferably higher than 70, defined by an x value of 0.20 to 0.45 and a y value of 0.20 to 0.45 and preferably defined by an x value of 0.29 to 0.36 and a y value of 0.31 to 0.36, in a chromaticity diagram of a CIE 1964 Yxy color system using a white light source measured with a D65 light source with a 10-degree angular field.

In a preferred embodiment, the intermediate layer of the solar photovoltaic module has, on its incident light side, a periodic or non-periodic structuration, said structuration comprising structures having a typical peak to valley dimensions larger than 0.1 μm, preferably between 0.15 μm-500 μm, said structures having a pitch larger than 1 μm, preferably between 1 μm-500 μm, said structures having lateral dimensions defined by their correlation length L, L being larger than 50 nm, preferably between 150 nm and 500 μm. As the interference filter is arranged on said intermediate layer, said interference filter has therefore said corrugated shape.

According to the invention, the interference filter should reflect at least 90% of the total light with a wavelength between 550 nm and 780 nm and reflect at least 75% of the total light with wavelengths between 380 nm and 550 nm, transmitting at the same time at least 90% of the total light with wavelengths between 780 nm and 1200 nm.

According to an embodiment of the invention the solar photovoltaic module comprises a photovoltaic element that has a high conversion efficiency for infrared light and preferably a high efficiency interdigitated back-contacted (IBC) type photovoltaic element should be used with an open circuit voltage preferably over 700 mV.

In another embodiment of the invention the photovoltaic element is a silicon hetero junction (HIT) type photovoltaic element with an open circuit voltage preferably over 700 mV.

In still another embodiment the photovoltaic cell is a silicon hetero junction (HIT) type photovoltaic element, with at least 5% of the surface covered with a layer of amorphous silicon (a-Si:H) or an alloy of amorphous silicon with at least one of the element selected from the group comprising oxygen, carbon, germanium and nitrogen.

According to the invention the three dimensional shaped arrangement of microstructures may form an array of micro lenses.

In another embodiment of the invention the intermediate layer is a flat, non-structured layer and the interference filter is disposed directly on said intermediate layer and has a corrugated shape in the plane of said interference layer.

In another embodiment of the invention additional optical layers are deposited on the incident light side the interference filter, and these layers have a transparency of at least 90% of light with a wavelength between 380 nm and 1200 nm. One of the additional optical layers may comprise an optical diffusion layer.

In another arrangement an optical window is assembled or fixed at the incident light side of the interference filter and may comprise an antireflection coating on at least one of its surfaces. The material of the window may be realized in glass or plastic a glass front element.

The invention relates also to a method for fabricating a solar photovoltaic module which comprises the steps of:
  providing a silicon based photovoltaic element;
  realizing flakes comprising optical layers designed to form an interference filter;
  incorporating said flakes in a binder;
  depositing said binder on a transparent substrate or alternatively embedding said interference filter in a liquid binder and coat a transparent material, preferably glass, by spraying or spin-coating.

The invention relates also to the specific use of the solar photovoltaic module as described in the present invention.

DETAILED DESCRIPTION

In the present description the wording "the incident light side" means the side of any element of the solar photovoltaic module exposed to incident sunlight. Also, the wordings "front" and "top" mean a side that is the closest to the incoming light side. Also, the term "corrugated" is to be understood in the present document as any deformation of a surface, sheet or layer, so that said surface, sheet or layer is not smooth and it has to be understood that the wording "corrugation" can comprise a wide variety of periodic or non-periodic structuration, deformation, induced roughness, undulation, texturing or the combination of said surface deformations of layers or sheets. The wording "corrugation" relates in this invention specifically to structures that have typical peak to valley dimensions larger than 0.1 µm, preferably between 0.15 µm-500 µm. The pitch of the corrugation is larger than 1 µm, preferably between 1 µm-500 µm. In the case of random "corrugation", the surface has a root-mean-square deviation larger than 20 nm, and preferably comprised between 150 nm and 500 µm. Even more specific, the lateral dimensions of the corrugation of the surface is defined by its correlation length L which is calculated as the radius where the autocorrelation peak drops to 1/e of its maximum value, assuming the shape of a section of a circle for the "corrugation". In this case, L is larger than 50 nm, but preferably between 150 nm and 500 µm.

Figure 1:
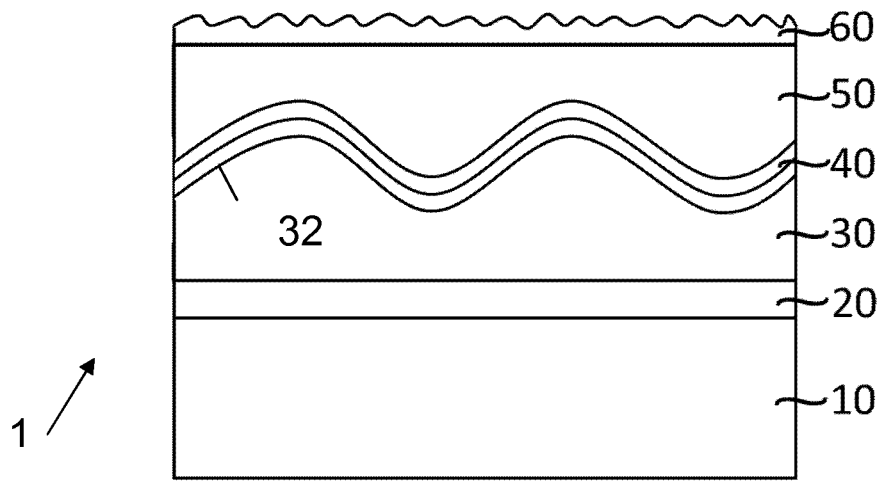
FIG. 1 illustrates a solar photovoltaic module.
Figure 2:
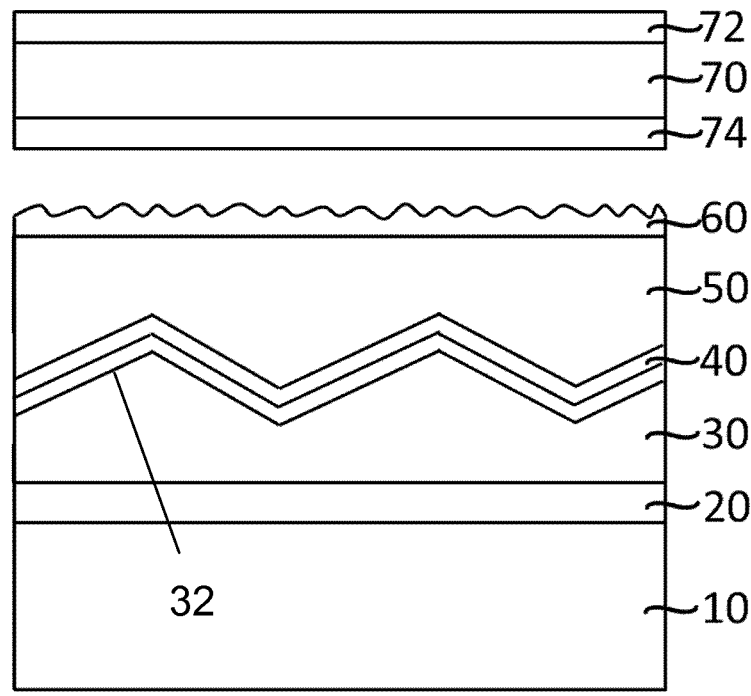
FIG. 2 illustrates another solar photovoltaic module with a front sheet.

FIG. 1 is an illustration of a preferred embodiment of the solar photovoltaic module 1 comprising, stacked on top of each other, at least one photovoltaic element 10, at least one encapsulant layer 20, at least one corrugated layer 30 having to the side of the incident light a corrugated surface 32, at least one corrugated interference filter 40, at least one optional additional structured layer 60 and an optional front sheet 70.

We will now describe the structure, the function, the used materials and optical characteristics of the elements of the solar photovoltaic modules as well as possible embodiments of these elements and of the solar photovoltaic module A) The Interference Filter 40.

The interference filter 40 is deposited on top of the corrugated layer 30 that is deposited either directly on the photovoltaic element or on an encapsulant 20 of the photovoltaic element 10. According to the invention, the interference filter 40 is designed to produce a very strong reflection and diffusion of the incident visible solar light and at the same time to possess a high transmission factor for near infrared light between 780 nm and 1200 nm.

Figure 4:
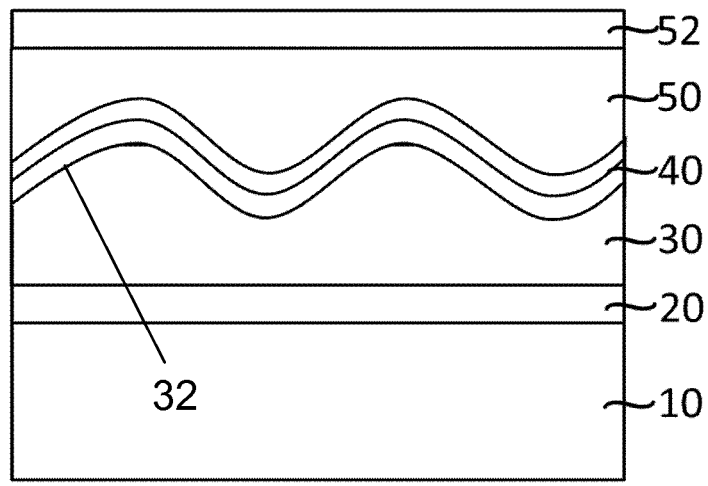
FIG. 4 illustrates another solar photovoltaic module comprising a protection layer deposited on a corrugated interference filter.
Figure 5:
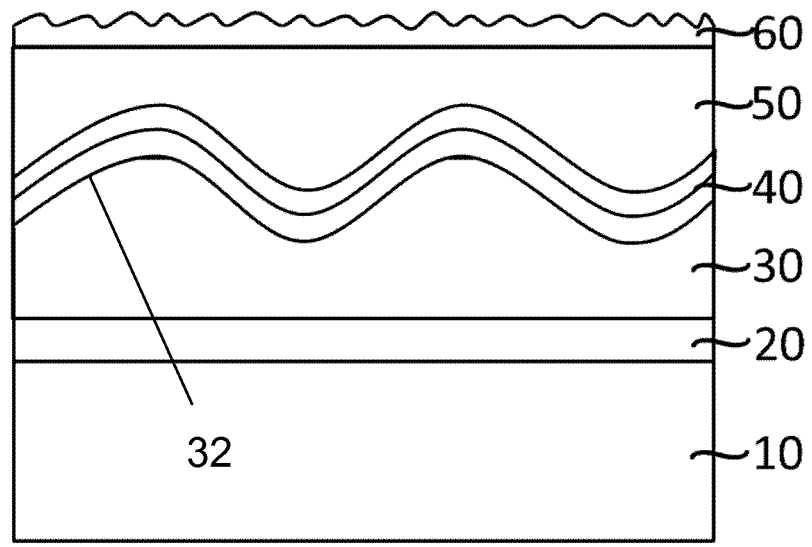
FIG. 5 illustrates a solar photovoltaic module comprising an additional scattering layer on top of the interference filter.

More especially, the interference filter 40 is composed of a multilayer comprising a plurality of dielectric layers, to transmit at least 75% of the total incident solar infrared light between 780 nm and 1200 nm, and to reflect and diffuse incident visible solar light such that the perceived color of said reflected and diffused visible light by any observer positioned anywhere to the incident light side of said solar photovoltaic module and looking towards the front element of said solar photovoltaic module is a white color defined by a Y10 tristimulus value not lower than 50, and preferably higher than 70, defined by an x value of 0.20 to 0.45 and a y value of 020 to 0.45 and preferably defined by an x value of 0.29 to 0.36 and a y value of 0.31 to 0.36, in a chromaticity diagram, illustrated in FIG. 4. The perfect white is represented in that diagram for the point with coordinates x10=0.3138 and y10=0.3310. In fact, this position represents the entire color stimulus caused by flat spectra of visible light. In the chromaticity diagram no information referring to the luminosity of the colors is present, so said point represents not only white but also black and all the grey scale of colors.

Figure 10:
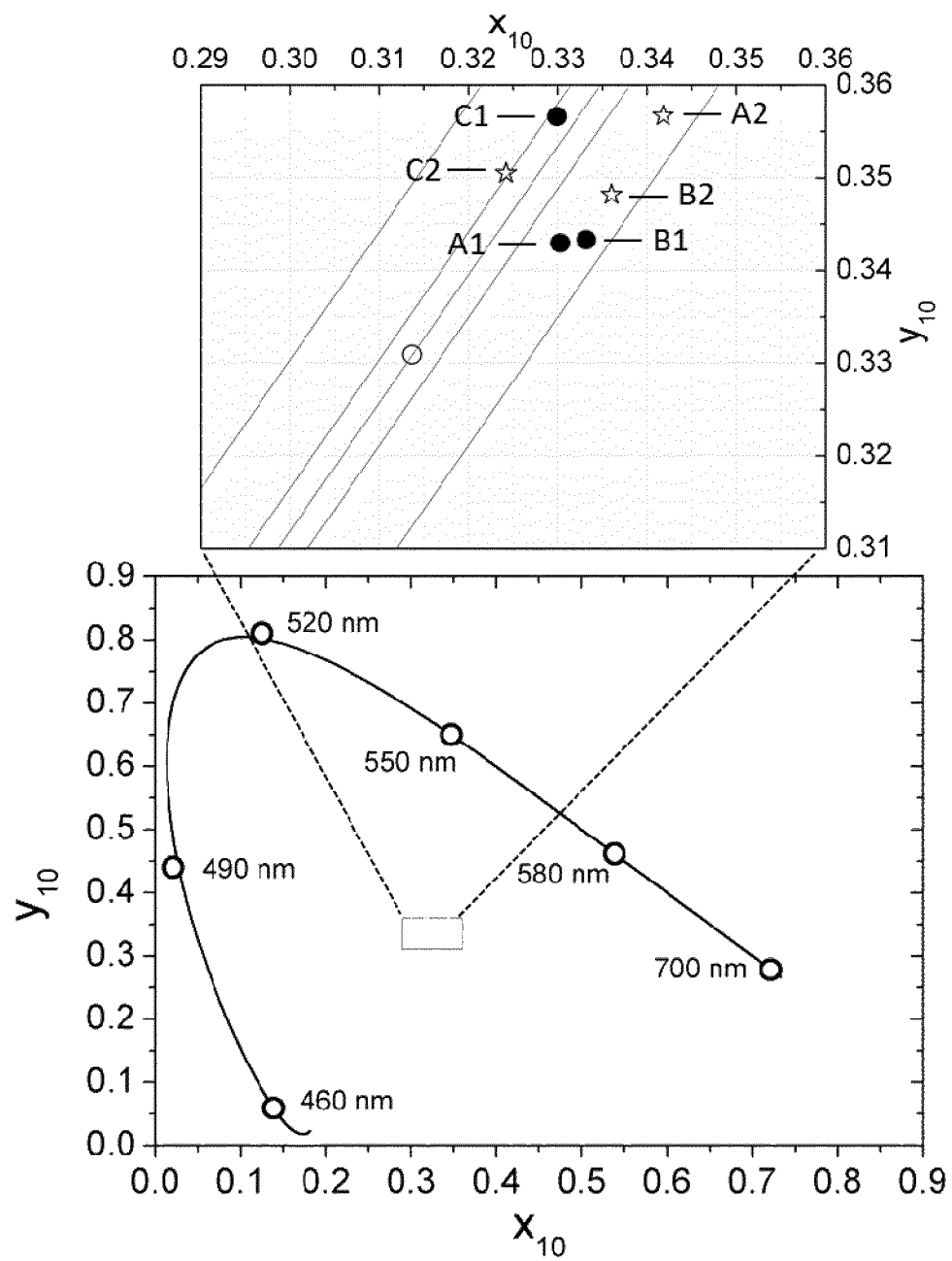
FIG. 10 shows the CIE 1964 (x10, y10) chromaticity diagram and a part of that diagram representing the conditions for a white appearance.

Thus, for an accurate description of a white appearance it is necessary to define a chromaticity domain together with a range of values for the luminosity. In the present invention the set of desired white colors is restricted to tint (T) values of −12 to 12, and preferably of −3 to 3 of a CIE 1964 Yxy color system using a white light source measured with a D65 light source with a 10-degree angular field (1964). If the tint values are positive the sample appears greenish while for negative values of tint the sample is reddish. The detailed part of FIG. 10 represents the chromaticity domain according to the present invention to produce an acceptable white appearance.

The interference filter 40 should not only reflect the incident visible part of the light as described but this reflected visible light should be diffused over a wide angle to the side of the incident sunlight. This is achieved for example by the corrugated shape of the interference filter 40. The corrugation of the interference filter 40 can be realized by different methods. In a first fabrication method a corrugated layer 30 is deposited onto the encapsulating layer 20 of the photovoltaic element and this layer has a corrugated surface to the incident light side. The interference filter 40 is deposited on said corrugated layer 30 so that the interference filter 40 will also have a corrugated shape and will have strong light scattering properties.

Figure 3:
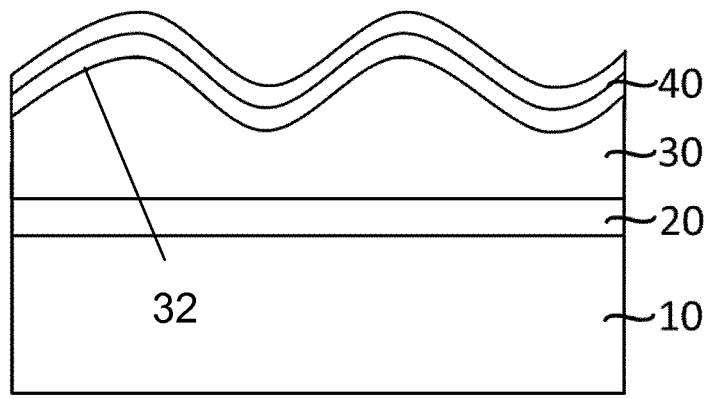
FIG. 3 illustrates an interference filter disposed on top of a corrugated layer deposited on a photovoltaic element.

There are different possible design and embodiments of said corrugated layer 30. In a preferred embodiment, as illustrated in FIG. 3, the corrugated layer 30 has a bell-shaped surface 32. This can be realized for example by well know embossing techniques, preferably of a polymer. In a similar embodiment, a sinusoidal undulation of the corrugated layer is realized over its whole surface. In yet another embodiment the surface of the corrugated layer is composed of a 2D array of areas comprising each a sinusoidal undulation but oriented 90° with the sinusoidal undulation of the adjacent corrugated area, each corrugated area having a typical dimension of 10 mm×10 mm, preferably 10 cm×10 cm, preferably greater than 10 cm×10 cm.

Figure 6:
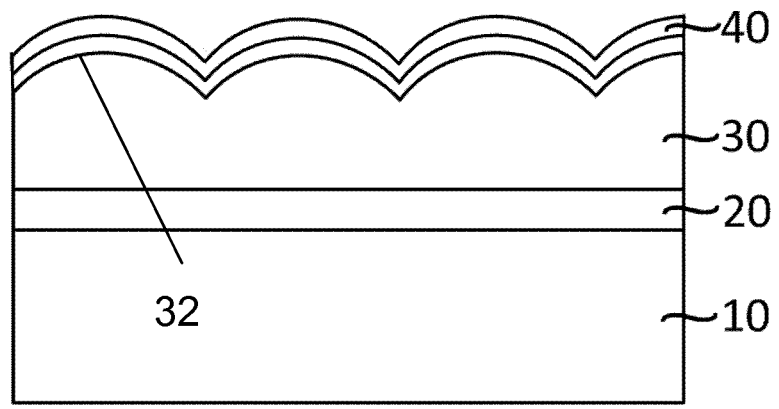
FIG. 6 illustrates an interference filter arranged on an array of microlenses realized on the photovoltaic element.

In another preferred embodiment, illustrated in FIG. 6, the surface 32 of the corrugated layer 30 has the shape of an array of hexagonally filled array of microlenses 32. In another embodiment the corrugated layer 30 may be realized on top of a transparent sheet, preferably a transparent glass or polymer sheet, and laminated with the encapsulant layer 20 on the photovoltaic element 10.

A person skilled in the art will be able to identify the different materials, thicknesses and number of the layers of which the interference layer is composed and will be able to produce an interference filter 40 which has the needed characteristics of the optical layer assembly of the present invention. Extensive literature is available for the design of multilayer interference filters, e.g. "Design methods for multilayer interference filters", G. Costagno et al., Applied Optics, Vol. 19, issue 3, pp. 386-388, 1990. It is well known that interference filters are typically composed of a stack of dielectric layers, preferably composed of alternative layers with different thicknesses of $SiO_2$ and $TiO_2$. The FIGS. 1-9 show interference filters 40 with only 2 layers for reasons of clarity. In practice the interference filter 40 comprises a large number of layers, preferably four, preferably more than 4 layers, and typically more than 8 layers.

Figure 11:
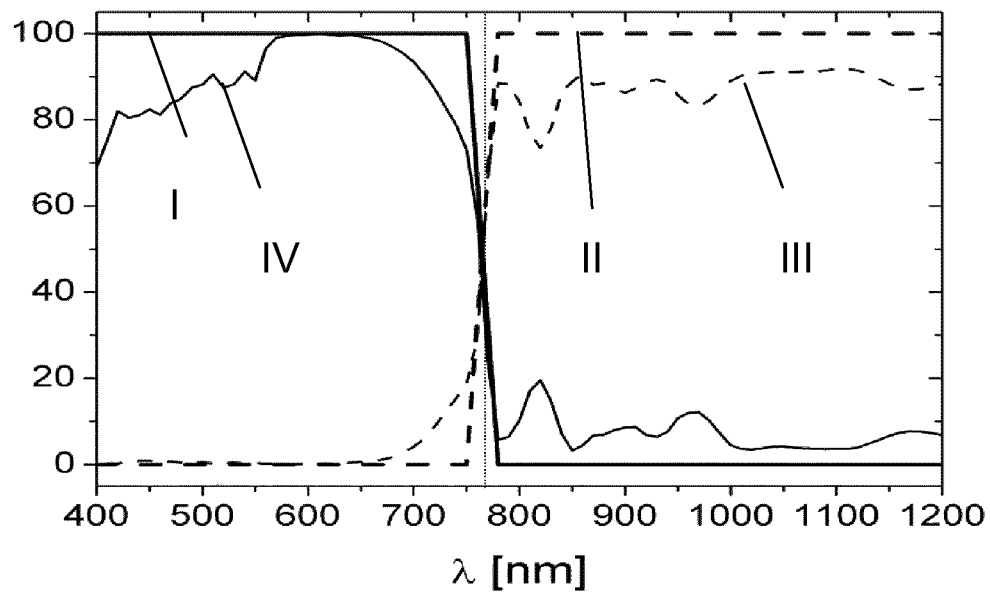
FIG. 11 shows the transmission spectra of interference filters of the solar photovoltaic module.

The interference filter 40 of the present invention should ideally reflect and diffuse 100% of the visible light below a wavelength of 780 nm and transmit 100% above a wavelength of 780 nm. Such an ideal characteristic is illustrated by the curves I-IV in FIG. 11. Curve I illustrates the ideal reflection spectrum and curve II illustrates the ideal transmission spectrum. Curves III and IV show respectively typical transmission and reflection spectra in a real case. In practice, as illustrated by the curve III of FIG. 11, the interference filter 40 will transmit less than 100% of the light above 780 nm and the spectrum of the reflected light will be slightly shifted to the red part of the visible spectrum.

Figure 7:
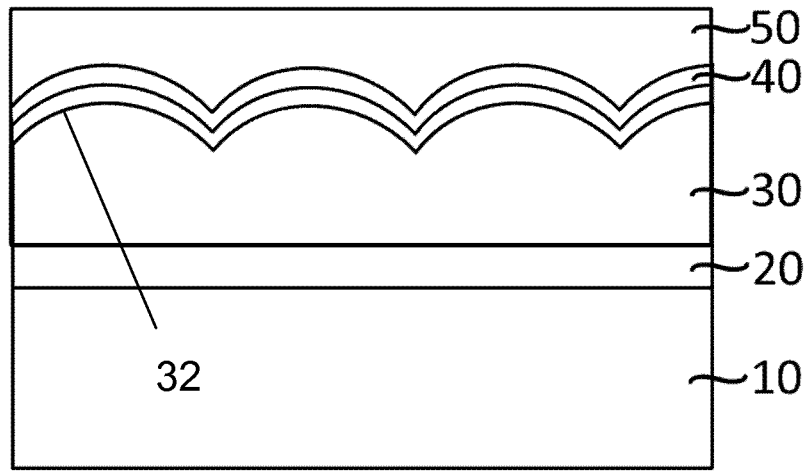
FIG. 7 illustrates a solar photovoltaic module comprising a protection layer deposited on a microlens array.

According to another embodiment of the invention, at least one additional layer 50 may be deposited on the incident light side of the interference filter 40, as illustrated in FIGS. 4 and 7. This additional layer 50 may be used as a protective layer and has a transparency of more than 90% for wavelengths between 380 nm and 1200 nm. An antireflection coating 52 may be deposited on at least one of the sides of said additional layer 50.

In order to improve the scattering of the light reflected by said corrugated interference filter 40 at least one additional textured layer 60 can be deposited directly on the incident light side of the additional layer 50. In one embodiment, said texture is produced by zinc oxide deposited by Low Pressure Chemical Vapor Deposition (LPCVD). This layer 50 provides a nanometric pyramidal roughness suitable to an efficient scattering of visible light. In yet another embodiment the textured layer 60 is deposited directly on the interference filter 40.

In yet another embodiment, said additional layers 60 can be deposited on a separate sheet that is disposed in front of the interference layer, preferably by glueing techniques, preferably by a lamination technique. The material of said additional layer 60 can be any transparent layer to visible and infrared light, preferably a polymer.

According to a further embodiment of the invention a front sheet 70 may be deposited or assembled to the incident light side of the interference filter 40 comprising optional additional diffusing layers. The front sheet 70 preferably comprises antireflection layers 72, 74 on at least one side of said front sheet 70. The front sheet 70 is preferably plastic, more preferably glass.

According to another embodiment of the invention, the interference filter 40 is obtained from a stack of polymers transparent to visible and near infrared light with varying refractive indices between 1.4 and 1.7. The stack of polymer is one-side or double-side embossed to produce a structuring such that scattering of visible light occurs. In another embodiment of the invention, illustrated in FIG. 9, the interference filter 40 with optional additional layers 50, 60 is obtained by incorporating flakes comprising said layers in a binder 31 and depositing the binder 31 on a transparent material substrate 25 substrate, each of said flakes having its surface randomly oriented to achieve a sufficient scattering of the visible light without any significant angular dependence. In another embodiment said flakes comprising optical layers comprising an interference filter are embedded in a liquid binder in order to allow the coating of a transparent material, preferably glass, by spraying or spin-coating.

According to the invention, the complete assembly of the optical layers 20, 30, 40, 50, 60, 70 layers in front of the photovoltaic element should have a white and opaque appearance to the observer. It is therefore important to advantageously choose materials for the encapsulant 20, the corrugated layer 30 and the optional additional diffusing layers 50, 60 so that they are highly transparent to near infrared light between 780 nm and 1200 nm. The assembly of the optical layers 20, 30, 40, 50, 60, 70 of the solar photovoltaic module, when measured in contact with a perfect black absorber, which is the case in first approximation by a crystalline silicon cell coated with an anti reflection coating, should have the specific following properties: the reflectance and scattering of the visible light should be enough to confer itself a white appearance to an observer positioned in a preferred solid angle between 0° and 45° to the normal to the solar photovoltaic cell.

B) The Photovoltaic Element 10 of the Solar Photovoltaic Module.

According to the invention, and as explained, visible light is reflected and scattered by optical layers disposed in front of a photovoltaic element 10 and these layers have a very high transmission of near infrared light. It is therefore an object of the invention to use a solar photovoltaic element 10 that has a maximum conversion efficiency for near infrared light, preferably between 780 nm and 1200 nm. The conversion efficiency for visible light has no importance as all visible light is reflected by the interference filter 40 so that no visible light reaches said solar photovoltaic element 10.

Preferably, according to the invention, a silicon heterojunction solar cell (HIT) is used as the solar photovoltaic element because it has very good optical transmission properties in the near infrared and on the other side it delivers an electrical voltage higher than 700 mV. These type of HIT photovoltaic elements are covered with at least 5% of the surface with a layer of Si:H or an alloy of amorphous silicon with at least one of the elements selected from the group comprising oxygen, carbon, germanium and nitrogen. Other promising solar photovoltaic elements can be used in solar photovoltaic modules such as a high efficiency interdigitated back-contacted photovoltaic element (IBC) and a standard crystalline silicon photovoltaic element (c-Si).

Operating under standard conditions and without any optical layer in front of them, the efficiency of these solar photovoltaic elements are respectively 22.7% in the case of HIT elements, 23.5% in the case of IBC elements and 18.2% in the case of c-Si elements. Thus, in normal conditions the IBC photovoltaic element is the one with the highest efficiency. However, using a filter with a 750 nm cut-off wavelength in front of the solar photovoltaic element, the maximum efficiency would be provided by the HIT photovoltaic element (11.2%) followed by the IBC photovoltaic element (10.9%) and the c-Si photovoltaic element (8.0%). The HIT photovoltaic element is obviously the most suited for the solar photovoltaic module 1 described in the present invention as it has a particularly high voltage together with a response in the near infrared close to ideal.

C) Examples and Characterization of the Optical Layers and the Solar Photovoltaic Module C1) The Optical Layer Assembly In what follows we describe the characteristics of three examples of an optical layer assembly of the solar photovoltaic module. In the three examples, the interference filter 40 is deposited on a periodic hexagonal array of microlenses 32 which are UV imprinted on glass. The lenses are separated by 150 microns from each other. The corrugated interference filter 40 transmits more than 80% of the light above 780 nm, while its reflectance and scattering properties of the visible spectrum are enough to appear white to an observer.

In a first example A, as shown in FIG. 6, an interference filter 40 is deposited on a hexagonally filled microlens array 32 that is laminated on the photovoltaic element 10 by using an encapsulant 20.

In a second example B, as shown in FIG. 7, a protection layer 50 interference filter is deposited on a hexagonally filled microlens array 32 that is laminated on the photovoltaic element 10 by using an encapsulant 20.

Figure 8:
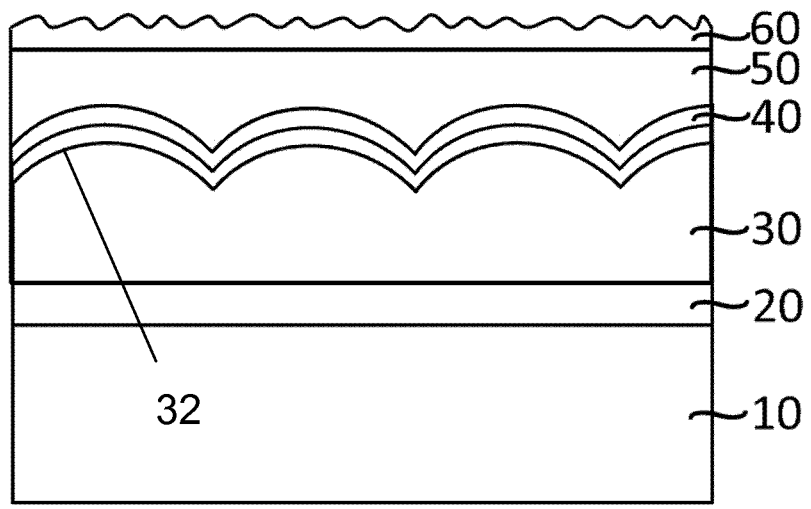
FIG. 8 illustrates a solar photovoltaic module comprising an additional light scattering layer on top of a corrugated interference filter deposited on top of a microlens array.

In a third example C, as shown in FIG. 8, an additional diffusing layer 60 is deposited on an intermediate layer 50 deposited on the interference filter 40 deposited on a hexagonally filled microlens array 32 that is disposed on the photovoltaic element 10.

Figure 12:
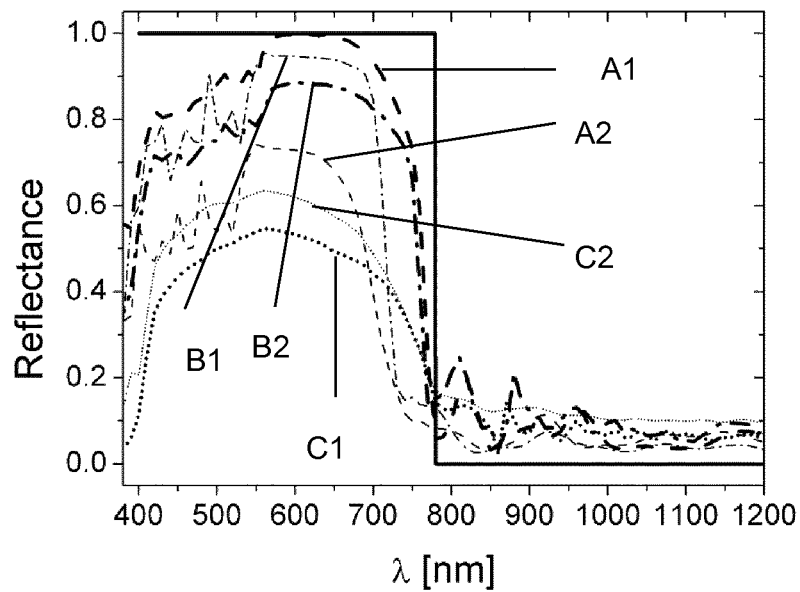
FIG. 12 shows reflection curves of an assembly of optical layers comprising a microlens array.

FIG. 12 shows the reflectance spectra measured for the three examples of a solar voltaic module comprising a microlens array 32 as detailed in FIG. 6, 7, 8. The transmission curves are obtained under two different viewing configurations: by illumination the sample by an incident beam whose axis is at an angle not exceeding 10° from its normal and by detecting the reflected radiation in two ways: either the reflected radian light power is collected using an integrating sphere placed in front of the solar photovoltaic module, which configuration designated as "0/d", or a detector is placed at 45-deg from the incident beam, which configuration is designated as "0/45°". Both light detection configurations are recognized as standard in the CIE system in order to estimate the color stimulus given to a normal observer of a light emitting sample under test. Using reflectance data together with the spectrum of the CIE standard illuminant D65 is possible to calculate chromaticity coordinates (x10, y10), Y10 tristimulus values and tint (T) for a 10 degree-field (CIE 1964). The values are calculated for each different case with the design shown in FIG. 6, 7, 8 and a summary is given in Table I.

TABLE I

Chromaticity coordinates (x10, y10), Y10 tristimulus value and tint (T) calculated under a D65 illuminant with a 10-deg field (CIE 1964) for the three particular embodiments of the invention, of which transmission spectra for the cases A1, A2, B1, B2, C1 and C2 are identified in FIG. 12.

| | Viewing condition | (x10, y10) | Y10 | T |
|---|---|---|---|---|
| Ex. A | A1: (0/d) | (0.3303, 0.3430) | 97.3 | −7.1 |
| | A2: (0/45°) | (0.3418, 0.3567) | 67.3 | −8.6 |
| Ex. B | B1: (0/d) | (0.3332, 0.3433) | 81.3 | −9.5 |
| | B2: (0/45°) | (0.3360, 0.3482) | 88.0 | −8.8 |
| Ex. C | C1: (0/d) | (0.3299, 0.3566) | 52.1 | 2.11 |
| | C2: (0/45°) | (0.3242, 0.3505) | 61.3 | 3.3 |

Figure 9:
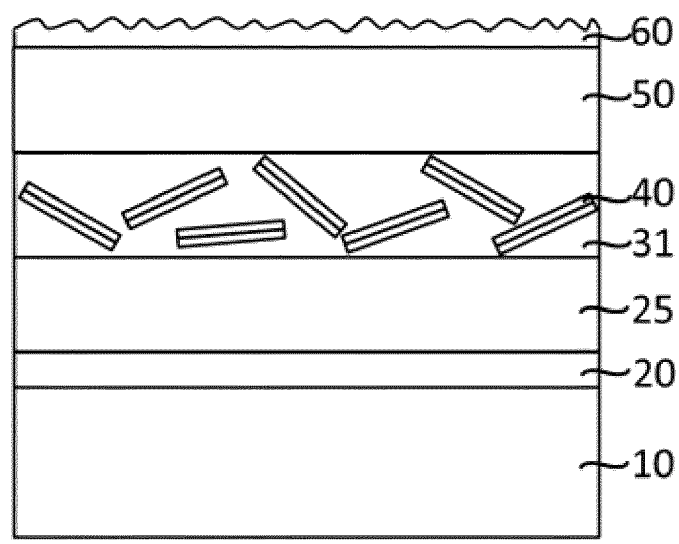
FIG. 9 illustrates flakes comprising interference filters imbedded in a binder layer

The points representing the color stimuli produced by the three particular embodiments, illustrated in FIG. 6, 7, 8 are displayed in the graphs of FIG. 9. The 3 examples will produce the desired effect, as all of them, independently of the viewing conditions (0/d) or (0/45°), will appear white to a normal observer.

C2) The Solar Photovoltaic Module

Figure 13:
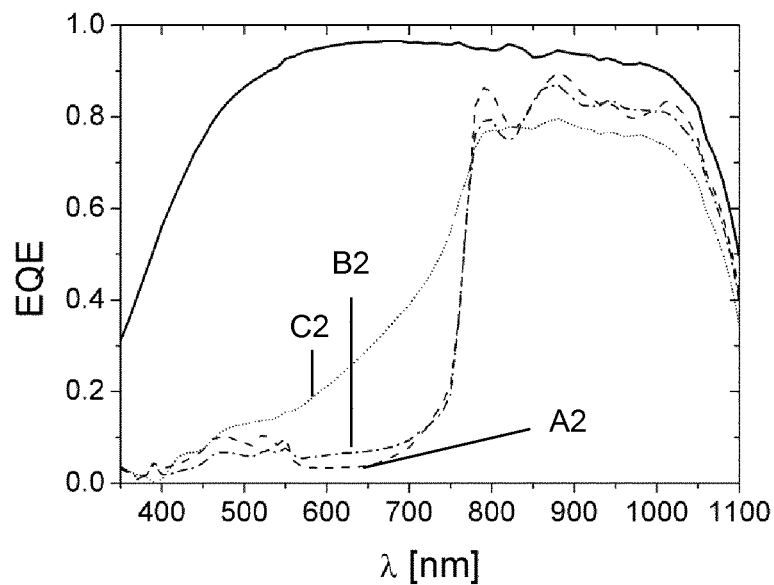
FIG. 13 shows a graph of the short circuit current and the efficiency of photovoltaic elements combined with interference filters.

We will describe now the characteristics of a preferred embodiment of a complete solar photovoltaic module. FIG. 13 shows the external quantum efficiency (EQE) of a state of the art HIT solar photovoltaic element 10 with and without one of the three particular optical layer assemblies, comprising a microlens array 32, as illustrated in FIG. 6, 7, 8. The corresponding quantum efficiencies of the cases A, B and C summarized in table I are shown in FIG. 13 as well as a reference curve, which is the EQE curve measured from the HIT cell without any layer from any embodiment of the invention in front. The HIT solar photovoltaic element 10 in this preferred embodiment of the solar photovoltaic module provides an output of more than 700 mV and a current density of 38.16 mA/cm2 when measurements are performed at wavelengths between 350 nm to 1100 nm. When adding each one of the three optical layer assemblies, the photovoltaic element 10 mainly converts the infrared part of the spectra to electricity, as almost all the visible light is reflected and scattered. The photovoltaic element 10 assembled with a microlens array 32 and an optical layer assembly as illustrated in FIG. 6, generates an electrical current density of 16.64 mA/cm2 and when combined with a microlens array 32 and an optical layer assembly comprising an additional front layer 50, as illustrated in FIG. 7, it generates 16.26 mA/cm2. These electrical current density values correspond to a total light-electricity conversion efficiency of nearly 10%, which is close to the expected efficiency of a solar photovoltaic module assuming a perfect optical assembly layer with a cut-off wavelength being 780 nm.

Better conversion efficiencies are expected using a microlens array 32 with a configuration of the optical assembly comprising an additional scattering layer 60, as illustrated in FIG. 8. In this case, the additional scattering layer 60 scatters incident light producing incident light on the interference filter 40 coming from different incident angles because of the scattering effect of said additional scattering layer 60. When the incident direction differs from the normal incidence on the interference filter 40, the response of said filter 40 will shift towards the blue part of the spectrum. Thus, using an interference filter 40 in the configuration illustrated in FIG. 8, a fraction of the visible light, mainly comprised between 550 nm to 750 nm, is not reflected but transmitted to the HIT cell, increasing as such its current to 19.21 mA/cm$^2$. This increase in electrical current produces a higher conversion efficiency of the solar photovoltaic module 1 and values over 11% can be expected.

Figure 14:
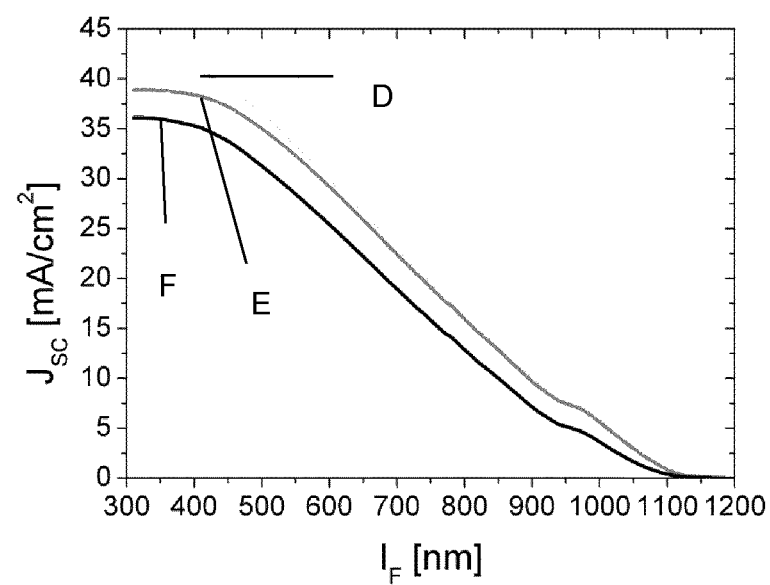
FIG. 14 illustrates short circuit currents of three types of photovoltaic elements in function of the cut-off wavelength of the interference filter.

As already stated, other promising photovoltaic elements 10 can be used in solar photovoltaic modules 1 such as a high efficiency interdigitated back-contacted photovoltaic element (IBC) and a standard crystalline silicon photovoltaic element (c-Si). To be of interest for the present described solar photovoltaic module these photovoltaic elements should have a voltage of over 700 nm. In order to compare the performance of the three types of photovoltaic elements, FIG. 14 illustrates the short circuit current (Jsc) of the three types of said photovoltaic elements as a function of the cut-off wavelength of the assembly of the optical layers: curve D corresponds to the IBC cell, curve E to the Hit cell and curve F to the c-Si cell.

Figure 15:
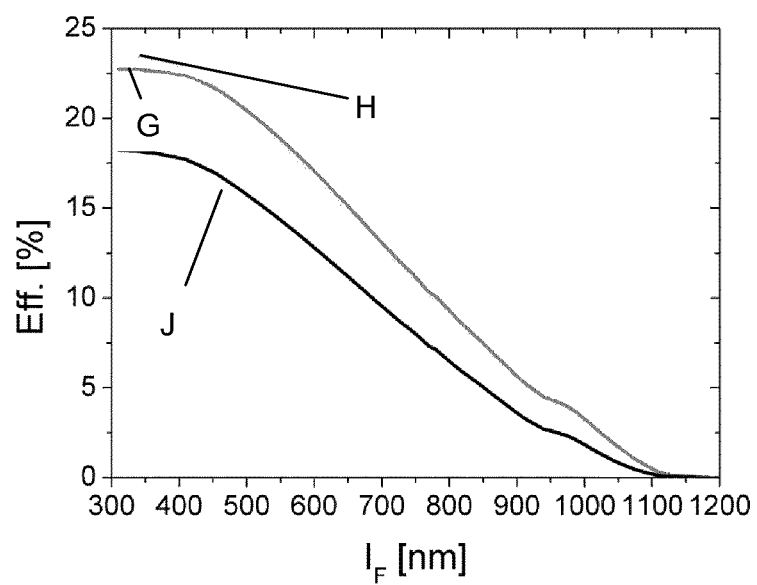
FIG. 15 Illustrates efficiencies of three types of photovoltaic elements in function of the cut-off wavelength of the interference filter.

FIG. 15 shows the total light-electricity efficiency as a function of the cut-off wavelength of the assembly of the optical layers for three different types of solar photovoltaic element 10 (curve G is for the HIT element, curve H for the IBC element and curve J for the c-Si element).

The invention claimed is:

1. A solar photovoltaic module, comprising:
a silicon based photovoltaic element;
an intermediate layer disposed on an incident light side of said silicon based photovoltaic element, the intermediate layer having a corrugated side configured to face the incident light;
a multilayer corrugated interference filter comprising at least four dielectric layers and having a first corrugated side and a second corrugated side configured to face the incident light, the first corrugated side of the multilayer corrugated interference filter disposed on the corrugated side of said intermediate layer; and
a front element disposed on the second corrugated side of said multilayer corrugated interference filter,
wherein said intermediate layer has a transparency of at least 90% for infrared light between 780 nm and 1200 nm and wherein the multilayer corrugated interference filter has a transmission of at least 75% of the total incident solar infrared light between 780 nm and 1200 nm, a reflection of at least 90% of the total light with wavelengths between 550 nm and 780 nm, and a reflection of at least 75% of the total light with wavelengths between 380 nm and 550 nm,
and wherein the first corrugated side of said multilayer corrugated interference filter disposed directly on the corrugated side of said intermediate layer,
wherein the intermediate layer has, on its corrugated incident light side, a periodic or non-periodic structuration, said structuration comprising structures having a typical peak to valley dimension larger than 0.1 μm, said structures having a pitch larger than 1 μm, said structures having a lateral dimension defined by a correlation length L, L being larger than 50 nm,
such that said solar photovoltaic module is configured to provide, by illumination of the sun, reflected visible light on the incident side having a white color defined by a Y10 tristimulus value not lower than 50, defined by an x value of 0.20 to 0.45 and a y value of 0.20 to 0.45 in a chromaticity diagram of a CIE 1964 Yxy color system using a white light source measured with a D65 light source with a 10-degree angular field.

2. The solar photovoltaic module of claim 1, wherein said multilayer corrugated interference filter is configured to transmit at least 90% of the total light with wavelengths between 780 nm and 1200 nm.

3. The solar photovoltaic module of claim 1, wherein the silicon based photovoltaic element has a maximum conversion efficiency for near-infrared light between 780 nm and 1200 nm.

4. The solar photovoltaic module of claim 2, wherein the silicon based photovoltaic element has a maximum conversion efficiency for near-infrared light between 780 nm and 1200 nm.

5. The solar photovoltaic module of claim 3, wherein the silicon based photovoltaic element is a high light-energy conversion efficiency interdigitated back-contacted (IBC) type photovoltaic element with an electrical voltage higher than 700 mV, said high light-energy conversion efficiency being higher than 10%.

6. The solar photovoltaic module of claim 4, wherein the silicon based photovoltaic element is a high light-energy conversion efficiency interdigitated back-contacted (IBC) type photovoltaic element with an electrical voltage higher than 700 mV, said high light-energy conversion efficiency being higher than 10%.

7. The solar photovoltaic module of claim 3, wherein the silicon based photovoltaic element is a silicon hetero junction (HIT) type photovoltaic element with a voltage over 700 mV.

8. The solar photovoltaic module of claim 4, wherein the silicon based photovoltaic element is a silicon hetero junction (HIT) type photovoltaic element with a voltage over 700 mV.

9. The solar photovoltaic module of claim 7, wherein the silicon based photovoltaic element is a silicon hetero junction (HIT) type photovoltaic element, with at least 5% of a surface covered with a layer of a-Si:H or an alloy of amorphous silicon with at least one element selected from the group consisting of oxygen, carbon, germanium and nitrogen.

10. The solar photovoltaic module of claim 8, wherein the silicon based photovoltaic element is a silicon hetero junction (HIT) type photovoltaic element, with at least 5% of a surface covered with a layer of a-Si:H or an alloy of amorphous silicon with at least one element selected from the group consisting of oxygen, carbon, germanium and nitrogen.

11. The solar photovoltaic module of claim 1, wherein said structures form an array of micro lenses.

12. The solar photovoltaic module claim 1, further comprising a plurality of additional optical layers that are disposed on the incident light side of the multilayer corrugated interference filter, and in that said plurality of additional optical layers have a transparency of at least 90% of light with a wavelength between 380 nm and 1200 nm.

13. The solar photovoltaic module of claim 12, wherein at least one of the additional optical layers of the plurality comprises an optical diffusion layer.

14. The solar photovoltaic module of claim 1, wherein said front element is an optical window, comprising an antireflection coating on at least one of its surfaces.

15. The solar photovoltaic module of claim 14, wherein said optical window is one of glass and plastic.

16. The solar photovoltaic module of claim 1, wherein a perceived color of said reflected visible light is defined by a Y10 tristimulus value greater than 70.

17. The solar photovoltaic module of claim 1, wherein a perceived color of said reflected visible light is defined by an x value of 0.29 to 0.36 and a y value of 0.31 to 0.36.

18. The solar photovoltaic module of claim 1, wherein the typical peak to valley dimension of the structures is between 0.15 µm and 500 µm, the pitch of the structures is between 1 µm and 500 µm, and the correlation length L of the structures is between 150 nm and 500 µm.

19. The solar photovoltaic module of claim 1, wherein the intermediate layer further includes a flat side configured to abut the incident light side of the silicon based photovoltaic element.

20. The solar photovoltaic module of claim 1, wherein the front element further includes a corrugated side configured to abut the second corrugated side of the multilayer corrugated interference filter.

21. The solar photovoltaic module of claim 1, wherein the reflected visible light of the solar photovoltaic module is provided in any direction.

* * * * *